United States Patent [19]

Kobayashi et al.

[11] Patent Number: 5,021,833

[45] Date of Patent: Jun. 4, 1991

[54] COPYING MACHINE WITH MULTIPLE LIGHT SOURCES

[75] Inventors: Toshiaki Kobayashi, Tenri; Yoshiaki Ibuchi, Nara; Naoyuki Kamei, Yamatokoriyama, all of Japan

[73] Assignee: Sharp Kabushiki Kaisha, Osaka, Japan

[21] Appl. No.: 448,730

[22] Filed: Dec. 11, 1989

[30] Foreign Application Priority Data

Dec. 13, 1988 [JP] Japan .................. 63-314402
Mar. 7, 1989 [JP] Japan ...................... 1-54546
Apr. 24, 1989 [JP] Japan .................. 1-48118[U]

[51] Int. Cl.⁵ .......................................... G03G 15/04
[52] U.S. Cl. ................................ 355/228; 355/229; 355/232
[58] Field of Search ............... 355/228, 229, 230, 232, 355/233, 45, 66, 71, 43, 46, 51, 27, 69, 243

[56] References Cited

U.S. PATENT DOCUMENTS

| 3,652,157 | 3/1972 | Blackert et al. | 355/232 X |
| 4,072,414 | 2/1978 | Hanson | 355/232 X |
| 4,077,714 | 3/1978 | Komori et al. | 355/230 X |
| 4,111,540 | 9/1978 | Bollman | 355/230 X |
| 4,234,250 | 11/1980 | Mailloux et al. | 355/233 X |
| 4,318,609 | 3/1982 | Knechtel et al. | 355/233 |
| 4,774,542 | 9/1988 | Kondo | 355/228 |

FOREIGN PATENT DOCUMENTS

| 0077860 | 6/1981 | Japan | 355/232 |
| 60-7424 | 1/1985 | Japan | . |
| 0070888 | 4/1987 | Japan | 355/232 |
| 0183458 | 7/1988 | Japan | 355/230 |

Primary Examiner—Arthur T. Grimley
Assistant Examiner—William J. Royer
Attorney, Agent, or Firm—Irell & Manella

[57] ABSTRACT

A copying machine including a first light source for illuminating an original on an original table, a second light source for illuminating a slidefilm, a slide projector having a slidefilm support which supports a slidefilm movably and the second light source, a mirror which is movable to a reflecting position for reflecting the light reflected from the original onto the photosensitive member as well as to a retracted position for allowing the light from the slide projector to be directly projected onto the photosensitive member, a detector for detecting whether the mirror is in the reflecting position or in the retracted position, and a light regulator for regulating power supply to either one of the first light source or the second light source which is selectively put into operation on the basis of the detected result of the detector.

10 Claims, 10 Drawing Sheets

COPYING MACHINE WITH MULTIPLE LIGHT SOURCES

BACKGROUND OF THE INVENTION

1. Field of the invention:

The present invention relates to a copying machine having a plurality of light sources for illuminating different kinds of originals.

2. Description of the prior art:

In copying machines using a photosensitive material, light is projected to expose the photosensitive material at an exposure position to form a latent image formed with selectively hardened pressure-rupturable capsules or an electrostatic latent image on the surface of the photosensitive material. In such copying machines, it is typical to scan the image of an original placed on an original table by means of an optical device and project the light reflected from the original onto the photosensitive material, but with the recent trend toward multifunctional performance, some copying machines are designed to be capable of using slidefilms as originals for copying on to paper. Conventional methods of copying slidefilms include the following.

(1) Light from a slidefilm is guided for projection to a stationary photosensitive member to expose the whole surface thereof for the formation of an image.

(2) Light from a slide projector is projected into a Fresnel lens mounted on an original table of a conventional scanning type copying machine, the projected light is then transmitted on to a photosensitive member by means of a scanning type optical device installed in the copying machine, and the photosensitive member is exposed to the light through a slit for the formation of an image.

However, the above-mentioned methods for copying slidefilms have had the following problems, respectively.

(1) Since the whole image forming area of the photosensitive member is exposed at one time, the photosensitive member is required to have a plane surface of the area that can hold the entire size of the formed image, which tends to increase the size of the image forming apparatus.

(2) Since the light is transmitted through a larger number of media to reach the photosensitive member than in a conventional copy process (copying an original placed on the original table), i.e. through a Fresnel lens and through lenses, mirrors, etc. for focusing the light from the slidefilm onto the Fresnel lens, luminous energy loss is very great. Also, the Fresnel lens, slide projector, etc. have to be disposed on or in the vicinity of the original table, which could cause scratching, breaking or other damage to the original table.

SUMMARY OF THE INVENTION

The copying machine of this invention, which overcomes the above-discussed and numerous other disadvantages and deficiencies of the prior art, is so arranged that light reflected from an original on an original table is directed through a prescribed light path, the light being reflected by a prescribed mirror disposed in said light path toward a moving photosensitive member, by operating an operating unit including a first light source, and said copying machine including a slide projector having a slidefilm supporting means which supports a slidefilm movably and a second light source which illuminates the slidefilm, said slide projector being provided in such a way that said mirror and said photosensitive member are positioned in the light path of said second light source, said mirror being movable to a reflecting position for reflecting the reflected light from the original onto the photosensitive member as well as to a retracted position for allowing the light from the slide projector to be directly projected onto the photosensitive member.

In a preferred embodiment, the copying machine further includes detecting means for detecting whether said mirror is in said reflecting position or in said retracted position.

In a preferred embodiment, the speed at which the photosensitive member is transported is changed on the basis of the detected result of said detecting means.

In a preferred embodiment, either one of said first light source or said second light source of said slide projector is selectively put into operation on the basis of the detected result of said detecting means.

In a preferred embodiment, a light regulator for regulating power supply to said first light source is connected to said first light source, said light regulator being connected to said second light source on the basis of the detected result of said detecting means.

Thus, the invention described herein makes possible the objectives of (1) providing a copying machine in which the image formation of a slidefilm can be accomplished without increasing the size of the photosensitive member and without the need for complicated control; (2) providing a copying machine in which a properly formed image can be obtained in either case in which an original is set on the original table or in which a slidefilm is set in a slide projector; and (3) providing a copying machine which comprises a first light source and a second light source, either one of which being selected for exposure and supplied with the power which regulated by one light regulator.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
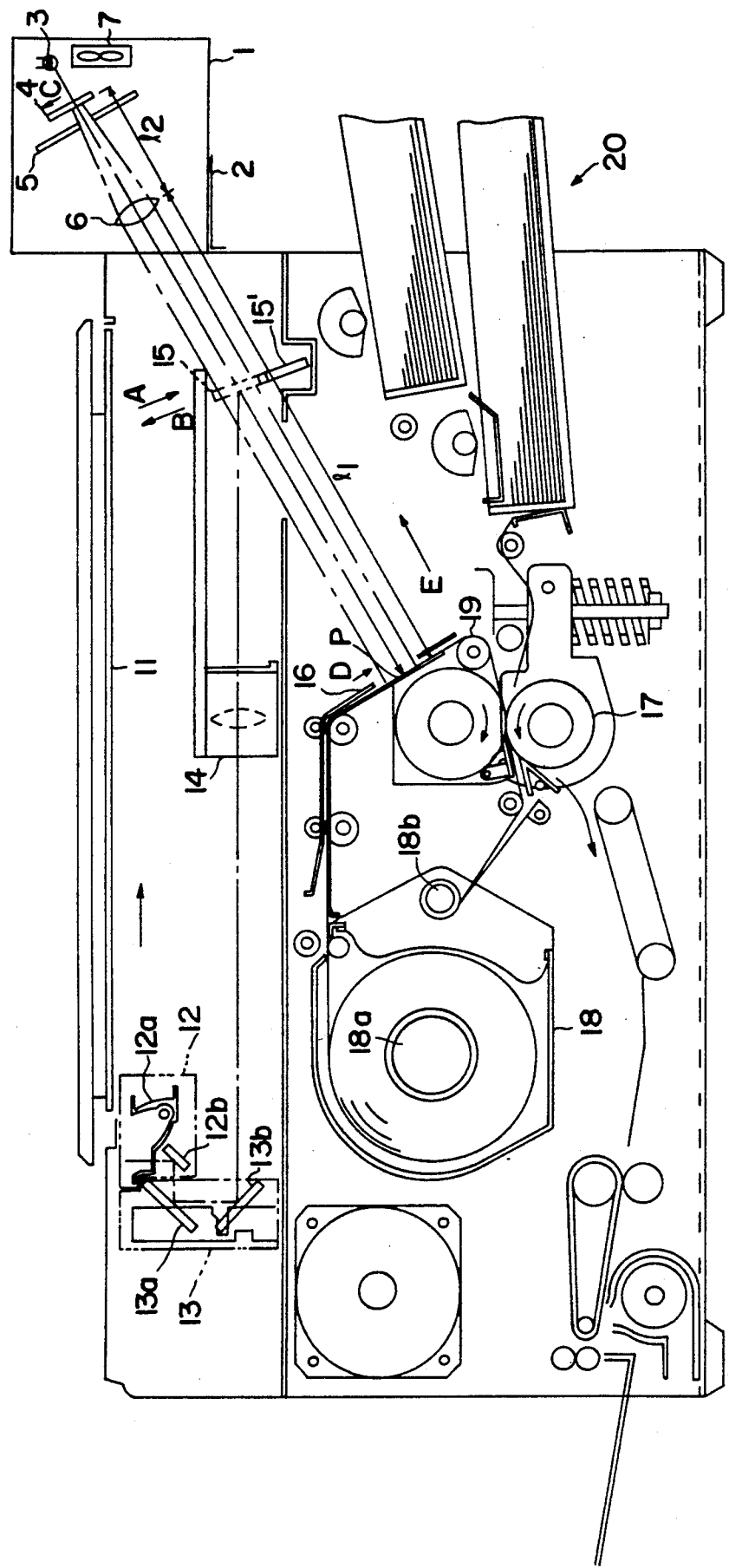
FIG. 1 is a schematic sectional view showing a copying machine of this invention.

FIG. 1 is a schematic view showing the construction of a copying machine in one embodiment of the present invention. In this embodiment, a photosensitive sheet formed from a film of polyester or other material on which photosensitive and pressure-sensitive pressure-rupturable capsules containing chromogenic materials are coated is used as a photosensitive member.

A pressure roller 17 is disposed in the middle part of the copying machine. To the upper left of the pressure roller 17, a cartridge 18 is mounted detachably with respect to the copying machine. The cartridge 18 contains a sheet supply rod 18a and a takeup rod 18b, the sheet supply rod 18a having a fresh photosensitive sheet wound thereon and the takeup rod 18b taking up the photosensitive sheet as it is used. The photosensitive sheet is drawn out from the sheet supply rod 18a in the direction shown by the arrow D in FIG. 1, and passes an exposure section P, a buffer roller 19, and the pressure roller 17 for the formation of an image before being taken up on the takeup rod 18b.

Light reflected from an original or transmitted through a slidefilm from a slide projector is projected onto the exposure section P, as will be described later. By exposure to the light reflected from the original or transmitted through the slidefilm, the pressure-rupturable capsules coated on the photosensitive sheet are selectively caused to harden. That is, only the pressure-rupturable capsules which are exposed to the light harden to form a latent image corresponding to the original or the slidefilm. When exposure is performed at the exposure section P, the buffer roller 19 is moved in the direction shown by the arrow E in FIG. 1 to draw out a new portion of the photosensitive sheet while storing a portion thereof having a previously formed latent image into an area to the upper right of the pressure roller 17. After the completion of the exposure, the pressure roller 17 is rotated to take the portion of the photosensitive sheet on which the latent image is formed into the pressure roller 17 for pressure transfer of the image. The pressure transfer is accomplished by rotating the pressure roller 17 to feed the photosensitive sheet which is superposed and pressed together on a image receiving sheet (a sheet coated with developing materials which give rise to colors with the chromogenic materials of the photosensitive sheet) delivered from a paper supply section 20. The unhardened pressure-rupturable capsules on the photosensitive sheet are made to rupture under pressure, causing the chromogenic materials to flow out, which react with the developing materials on the image receiving sheet to form a colored image thereon.

The major parts of the present invention, i.e. an optical system which guides the light reflected from an original to the exposure section P and a slide projector which guides the light transmitted through a slidefilm to the exposure section P will be now described. First, the optical system is described below.

On the top surface of the copying machine is mounted an original table 11 formed from a light transmitting material like glass, on which an original to be copied is placed. Disposed under the original table 11 is an optical system which comprises a light source unit 12 having a light source 12a and a mirror 12b, a mirror unit 13 having mirrors 13a and 13b, a lens 14, a mirror 15, and a slit 16. The mirror 15 is a movable mirror. The light source unit 12 and the mirror unit 13 are mounted movably in both right and left directions in parallel with the original table 11. When these units are moved in the right-hand direction, the original placed on the original table 11 is scanned, and the light reflected from the original is transmitted via the mirrors 12b, 13a, and 13b, the lens 14, and the mirror 15 on to the exposure section P which is described later. The slit 16 is provided to block unwanted light in order that line scanning can be performed. The mirror unit 13 moves at half the speed of the light source unit 12 to keep the distance from the original to the exposure section P at a constant value. The lens 14 is movable along its optical axis to allow the setting of copy magnification ratio within the range of 50–200%.

The light reflected from the original or transmitted through the slidefilm must be directed to the exposure section P to reach the surface of the photosensitive sheet at a right angle. If the light is projected at an oblique angle to the photosensitive sheet, the resulting image would be blurred. Therefore, it is so constructed that both the light reflected from the original and the light transmitted through the slidefilm take the same light path at least just before reaching the exposure section P. To achieve this purpose, the mirror 15 (movable mirror) is supported movably to select either the light reflected from the original, or the light transmitted from the slidefilm for projection onto the exposure section P (i.e. onto the photosensitive member). That is, the mirror 15 may be moved either in such a position so that the light reflected from the original is reflected by the mirror 15 for projection onto the exposure section P (hereinafter referred to as "the reflecting position"), or in such a position so that a light path is opened for the light transmitted through the slidefilm to reach the exposure section P (hereinafter referred to as "the retracted position").

The mirror 15 is held on a supporting member (not shown), and is movable in directions shown by arrows A and B by means of a solenoid, a motor or the like. In this embodiment, the mirror 15 is supported movably by means of a solenoid and a spring. When the mirror 15 is moved in the direction shown by the arrow A to position itself outside the light path for the light reflected from the original, the light from a slide projector 1 mounted to the upper right of the mirror 15 is brought to the exposure section P through a light path made available by moving the mirror 15.

A bracket 2 in the upper part of the right side panel of the copying machine is capable of being opened downwardly at a right angle with respect to the panel. With the bracket 2 in the opened position, the slide projector 1 is mounted on the bracket 2. The slide projector 1 includes a light source 3, a slidefilm supporting member 4, a slit 5, and a lens 6. The light source 3 consists for example of a bulb-shaped halogen tungsten lamp. A slidefilm is supported on the slidefilm supporting member 4 which is movable in the direction shown by an arrow by means of a motor not shown. The light from the light source 3 is projected through the slidefilm mounted on the slidefilm supporting member 4, the slit 5, and the lens 6 onto the exposure section P. For exposure, the slidefilm supporting member 4 is controlled to move in the direction shown by the arrow C so that the light transmitted through the slidefilm is projected through the slit onto the exposure section P When the distance from the surface of the photosensitive sheet in the exposure section P to lens 6 of the slide projector is denoted as l1, and the distance from the lens 6 to the slidefilm supporting member 4 (i.e. slidefilm) as l2, k=l2/l1 represents the magnification ratio of the slidefilm image projected on the photosensitive sheet. When k=1/7, an image having an approximately B5 size will be formed. Therefore, in this embodiment, the lens 6 and the slidefilm supporting member 4 are disposed in such a relationship that the value k is approximately equal to 1/7. The value k may be set so as to form a slightly larger or smaller image, or alternatively, a zoom lens may be mounted movably along its optical axis so as to allow the variable setting of the magnification ratio.

A fan 7 is used to transfer the heat generated by the light source 3 to the outside.

Figure 2:
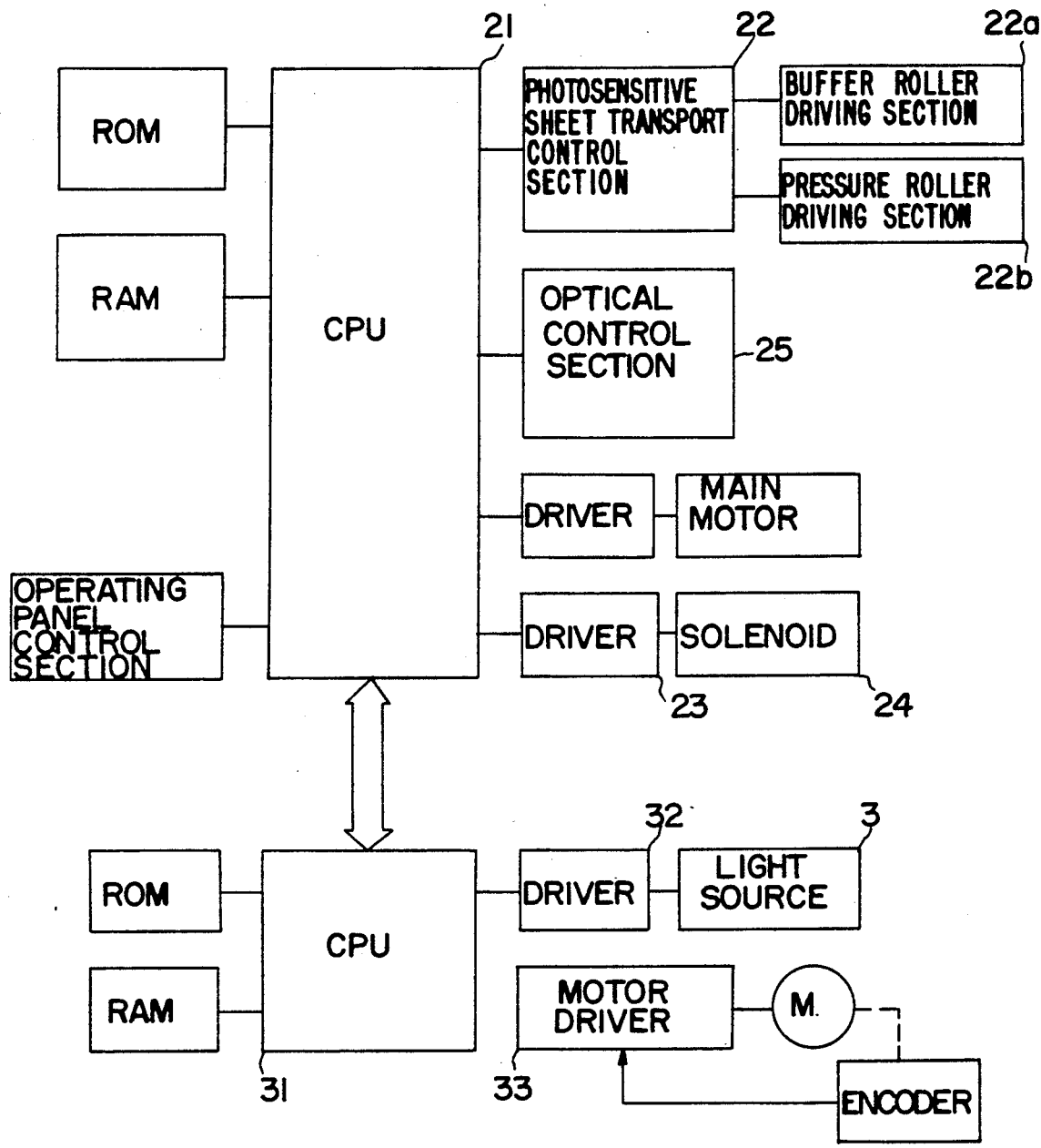
FIG. 2 is a block diagram illustrating control sections of the copying machine of FIG. 1.

FIG. 2 is a block diagram of the control sections for the copying machine and the slide projector of the present invention.

A CPU 21 for the copying machine is coupled to a CPU 31 for the slide projector by means of a connector. When the connector is fastened, the CPU 21 outputs a driving signal to a driver 23. The driver 23 is used to drive the solenoid for moving the mirror 15 in the direction shown by the arrow A to the retracted position so as to open the light path for the slide projector.

A photosensitive sheet transport control section 22 drives a buffer roller driving section 22a and a pressure roller driving section 22b to transport the photosensitive sheet at a prescribed speed. The buffer roller driving section 22a and the pressure roller driving section 22b, respectively, drive the buffer roller 19 and the pressure roller 17 at suitable speeds to match the photosensitivity and pressure sensitivity of the photosensitive sheet. On the other hand, an optical control section 25 controls the speed for scanning the original to match the speed of the buffer roller 19 so that the light reflected from the original is projected onto the exposure section P. For example, for an actual size copy, the speed for scanning the original is controlled at the same speed as that of the photosensitive sheet transported by the movement of the buffer roller, while for a magnification ratio of 200%, the speed for scanning the original is controlled at ½ that of the photosensitive sheet transportation.

The CPU 31 for the slide projector is coupled to a driver 32 which controls the light source 3 and to a motor driver 33 which controls a motor M used to move the slidefilm supporting member 4. The slidefilm supporting member 4 is controlled to move at such a speed as to match the photosensitive sheet transporting speed and the magnification ratio at the time of exposure. When the magnification ratio is set for example to 7 (k=1/7), the speed at which the slidefilm supporting member 4 is moved is controlled at 1/7 that of the photosensitive sheet transportation.

With the above construction, when an original placed on the original table 11 is copied, the optical system scans the original on the original table 11, and the light reflected from the original is projected to the exposure section P by the movable mirror which is in the reflecting position so as to form a latent image on the photosensitive sheet. On the other hand, when the slidefilm is copied, the slide projector 1 is mounted on the copying machine, the light source for the slidefilm is turned on, and the slidefilm is moved by a slidefilm moving means. The light transmitted from the slidefilm is projected on to the exposure section P to form a latent image on the photosensitive sheet. The latent image thus formed is then fed to the pressure roller for pressure transfer of the image. Thus, the image formation of a slidefilm can be accomplished without increasing the size of the photosensitive member and without the need for complicated controls.

In this embodiment, a photosensitive sheet is used as a photosensitive member, but alternatively, a photosensitive member having photoconductivity such as employed in a conventional copying machine may be used. Also, neither the position for mounting the slidefilm nor the shape of the copying machine itself is not limited to the example described in this embodiment. For example, the mounting angle of the movable mirror may be made variable for selectively directing the light reflected from the original or transmitted through the slidefilm to the photosensitive member.

Example 2

Figure 3:
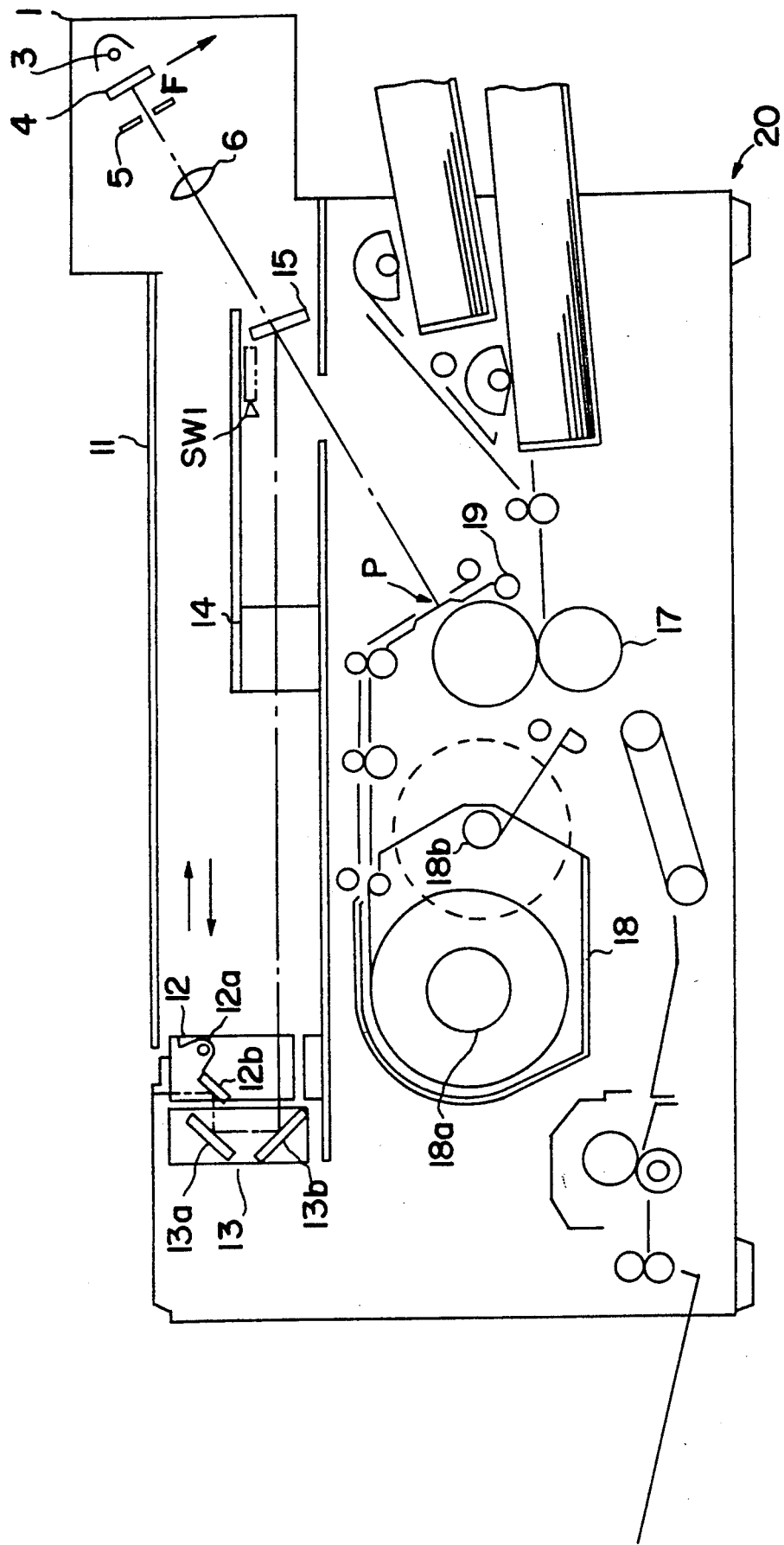
FIG. 3 is a schematic sectional view showing another copying machine of this invention.
Figure 4:
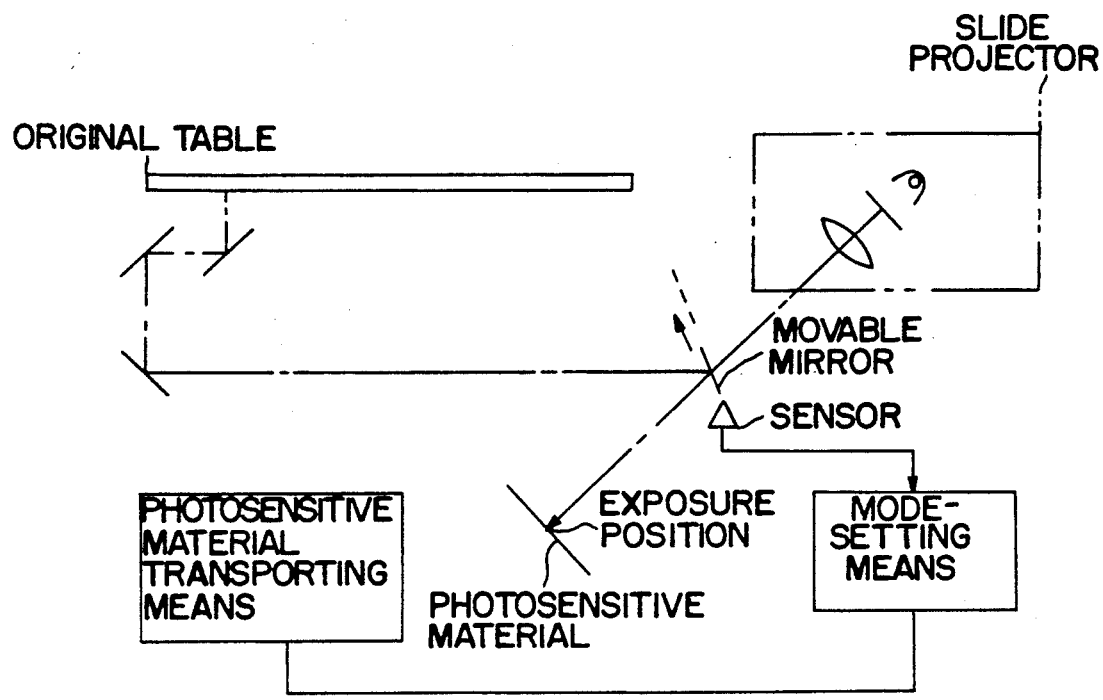
FIG. 4 is a conceptual diagram illustrating an important part of the copying machine of FIG. 3.

The mirror 15 disposed between the slide projector 1 and the exposure section P may be mounted in a swingable fashion as shown in FIG. 3. FIG. 4 shows a conceptual diagram of this embodiment.

Figure 5:
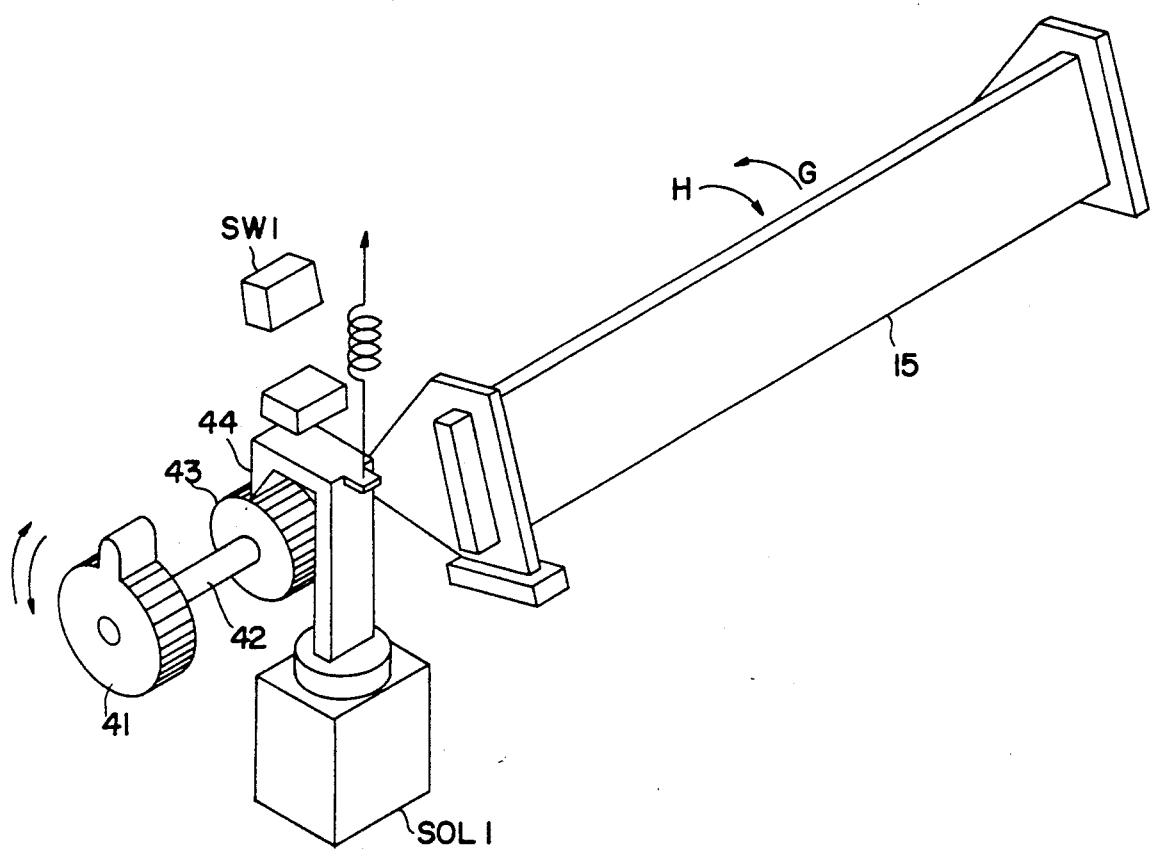
FIG. 5 is a perspective view showing a rotating mechanism of a mirror of the copying machine of FIG. 3.

As shown in FIG. 5, a mirror 15 is rotatable in directions shown by arrows G and H by the operation of a knob 41, and can be moved to a position shown by a two-dot chain line in FIG. 3. At this time, part of the mirror 15 comes in contact with the actuator of a switch SW1 to activate the switch SW1. Also, on a shaft 42 connecting the knob 41 with the mirror 15, a ratchet 43 is provided coaxially. A pawl 44 fixed to the actuator of a solenoid SOL1 is positioned facing and above the ratchet 43. When the solenoid SOL1 is energized, the pawl 44 moves downward to engage the ratchet 43 so as to prevent the mirror 15 from being rotated by the operation of the knob 41.

Figure 6:
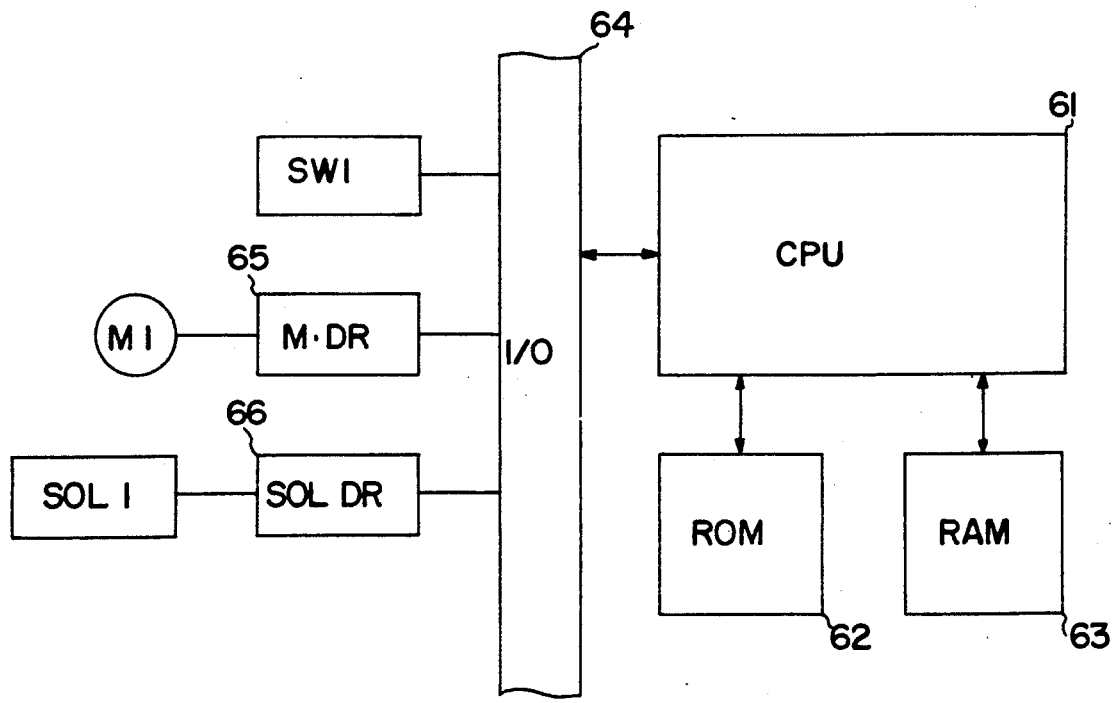
FIG. 6 is a block diagram illustrating important parts of a control section of the copying machine of FIG. 3.

FIG. 6 is a block diagram illustrating the important parts of the control section for the above copying machine.

Switch SW1 "on" data is input to a CPU 61 via an I/O interface 64. A ROM 62 coupled to the CPU 61 contains a program to control the functions of the CPU 61. The CPU 61 feeds control data to a motor driver 65, a solenoid driver 66, etc. under the control of that program. At this time, part of the memory area of a RAM 63 is assigned as a working area. The motor driver 65 controls the rotating speed of a main motor M1. The solenoid driver 66 drives the solenoid SOL1 in a selected manner. The main motor M1 supplies rotating force to the pressure roller 17, the takeup rod 18b, a paper supply roller 42, a transport belt, a paper ejection roller, etc. via a transmission mechanism (not shown).

Figure 7:
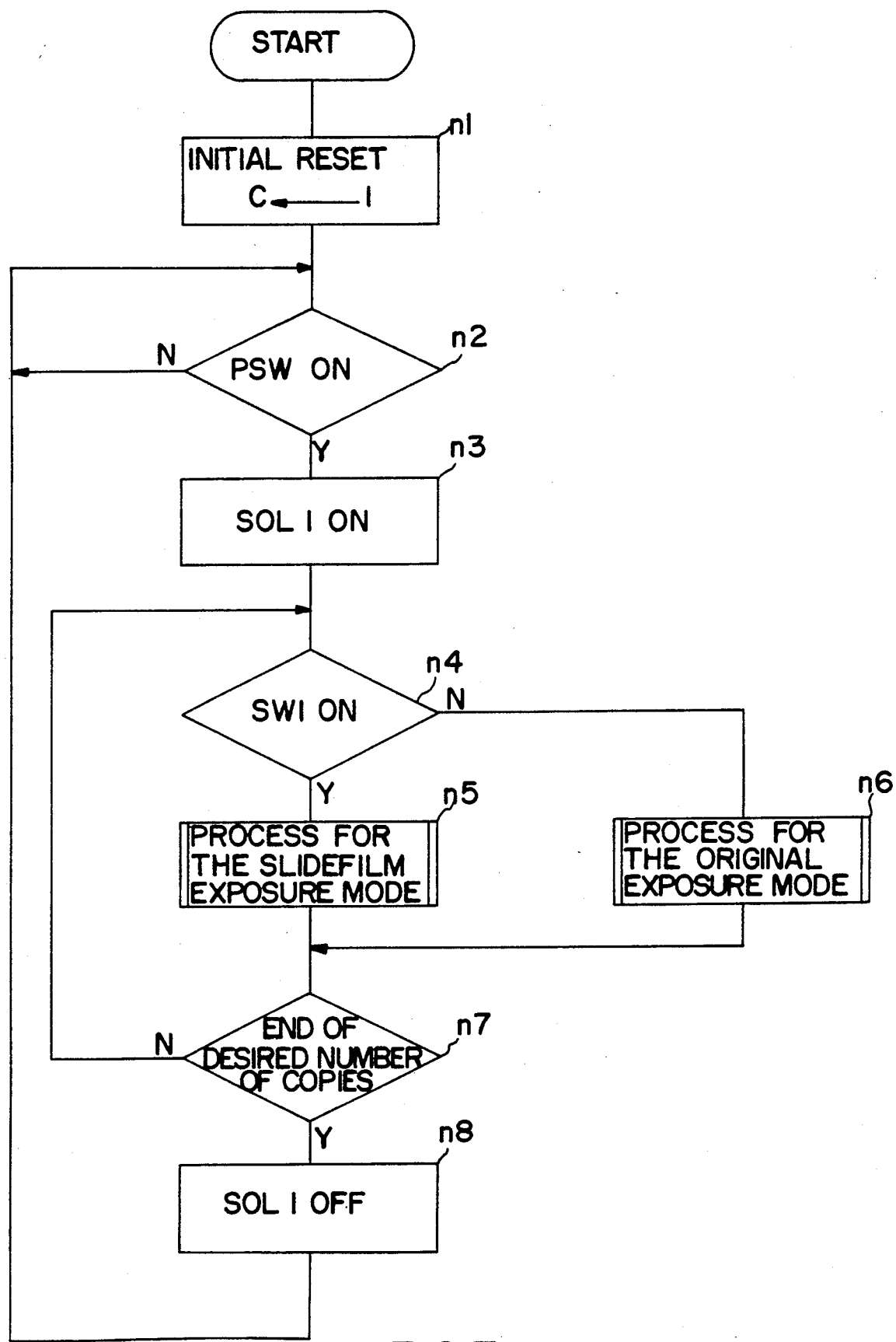
FIG. 7 is a flow chart illustrating part of the processing procedure of a control section of the copying machine of FIG. 3.

FIG. 7 is a flowchart illustrating part of the processing procedure of the control section for the copying machine of this embodiment.

After the completion of the initial performance, the CPU 61 is put in a standby state for the operation of the print switch (n1, n2). When the print switch is operated, the solenoid SOL1 is energized (n3). When the solenoid SOL1 is energized, the knob 41 becomes locked to hold the mirror 15 in position. Next, the CPU 61 checks the on/off state of the switch SW1 (n4), and executes the processing for the slidefilm exposure mode when the switch SW1 is on (n5), and the original exposure mode when the switch SW1 is off (n6). In the slidefilm exposure mode, a slidefilm mode lamp provided on an operation panel not shown is turned on, and the light source 3 of the slide projector 1 is put into operation while the slidefilm supporting member 4 disposed in its light path is moved in the direction shown by the arrow F in FIG. 3. At the same time, the main motor M1 is driven at a prescribed speed. On the other hand, in the original exposure mode, the light source 12a of the optical system is put into operation with the slidefilm mode lamp staying off, and an optical system motor not shown is driven to move the optical system in horizontal directions under the original table 11, while the main motor M1 is driven at a speed that matches a preset copy magnification ratio.

In this embodiment, the switch SW1 detects whether the mirror 15 is positioned in the light path for the original exposure, and depending on the on/off state of the switch SW1, the processing is executed for the slidefilm exposure mode or the original exposure mode which respectively requires different transporting speeds of the photosensitive sheet. Since the moving of the mirror 15 is operated by the manual operation of the operator, the copy process of the desired mode can be put into operation by processing the mode according to the on/off state of the switch SW1. Also, by setting the mode to be executed according to the position of the movable mirror, a properly formed image can be obtained in either case in which an original is set on the original table or in which a slidefilm is set in a slide projector.

Also in this embodiment, the knob 41 is manually operated to select the position of the mirror 15, but alternatively, a selector switch may be provided on the operation panel to select the position of the mirror 15 using a motor or the like. Furthermore, in this embodiment, description has been given taking as an example the copying machine in which a copy image is formed on a image receiving sheet using a photosensitive sheet as a photosensitive member, but the present invention can also be applied to an electrophotographic copying machine in which a copy image is produced from an electrostatic latent image formed by an exposure process on a photoconductor used as a photosensitive member.

Example 3

Figure 8:
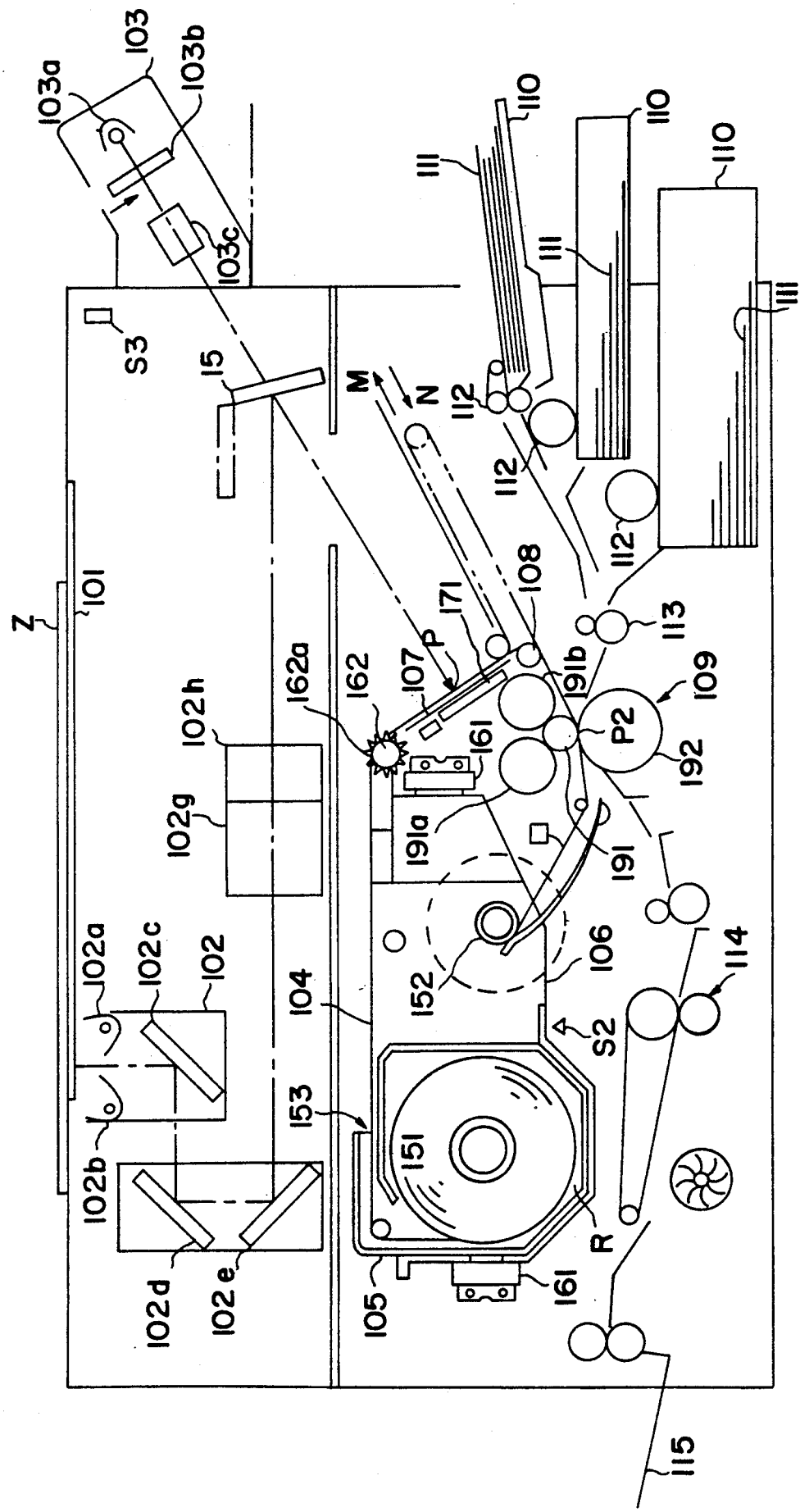
FIG. 8 is a schematic sectional view showing still another copying machine of this invention.

An image forming apparatus shown in FIG. 8 has on its top surface an original table 101 formed from transparent hard glass. On the original table 101, an original Z to be copied is placed with its copy side facing down. Beneath the original table 101 is disposed an optical system 102 which comprises light sources (first light sources) 102a and 102b, mirrors 102c to 102e, a lens 102g, and a filter 102h. The original Z on the original table 101 is illuminated by the light sources 102a and 102b, and the light reflected from it is transmitted via the mirrors 102c to 102e and 15, the lens 102g, and the filter 102h on to an exposure point hereinafter described. The filter 102h comprises a plurality of filters having different transmitting wavelengths, and is used for color correction by adjusting the amount of each filter inserted into the light path. The insertion amount of each filter is determined according to the sensitivity characteristics of the photosensitive sheet used, the desired image color, and other factors.

On the right side of the image forming apparatus, a slide projector 103 is detachably mounted. As in the case of the foregoing example 1, a slide projector 103 includes a light source (a second light source) 103a, a slidefilm supporting member 103b, and a lens 103c. A slidefilm to be copied is inserted in the slidefilm supporting member 103b. The lens 103c is equipped with a filter for color correction. On the other hand, an optical mirror 15 into which the light from the original is reflected is mounted swingably, and is swung approximately 90 degrees by operating a knob provided on the front side of the copying machine. The mirror 15, which has the same construction as that shown in FIG. 5 for the example 2, is rotatable in the directions shown by the arrows G and H by operating the knob 41, and can be moved to the position shown by the two-dot chain line shown in FIG. 3. When the mirror 15 is swung, part of the mirror 15 comes in contact with the actuator of the switch SW1 to activate the switch SW1.

Figure 9:
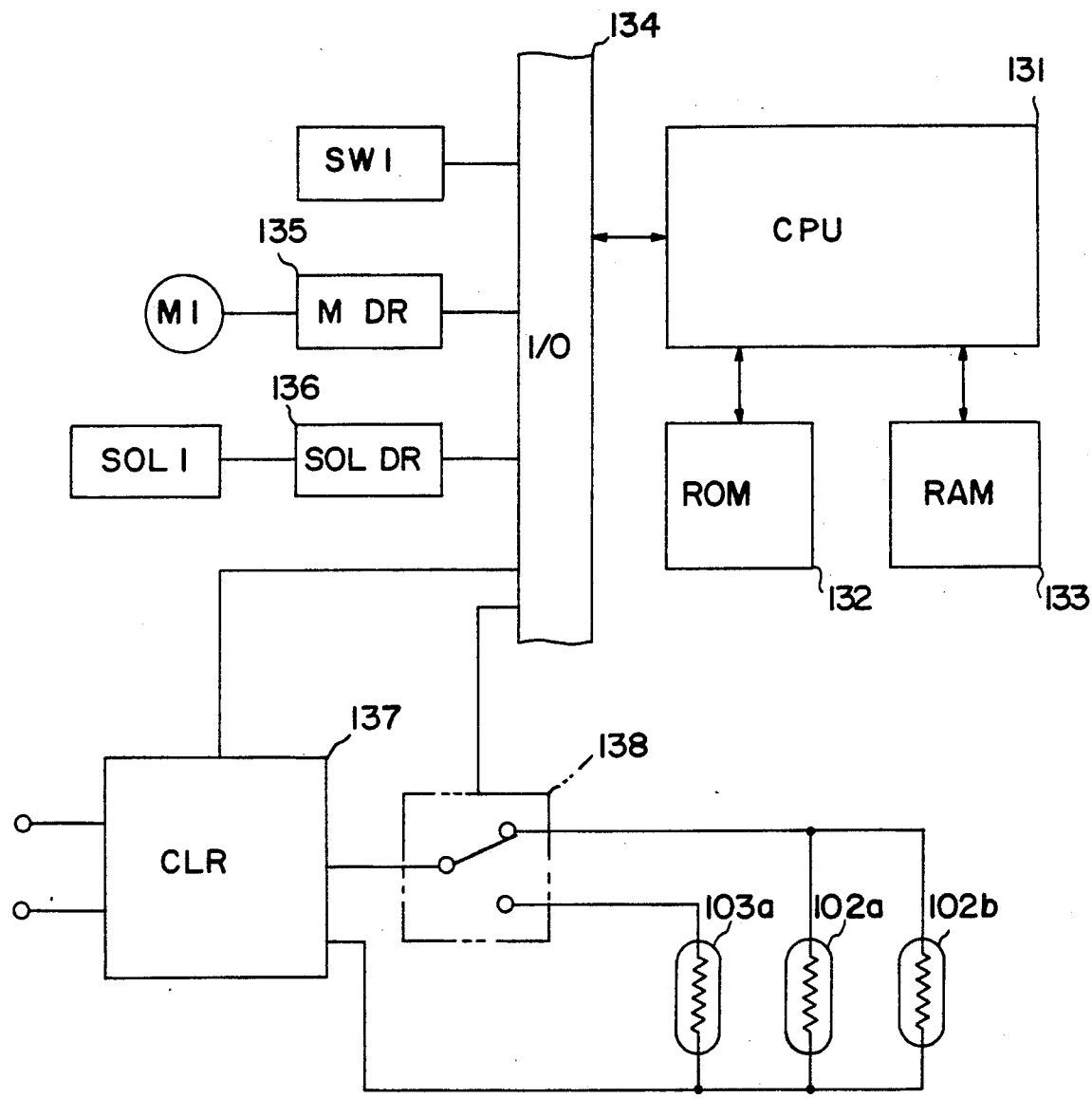
FIG. 9 is a block diagram illustrating important parts of a control section of the copying machine of FIG. 8.

FIG. 9 is a block diagram showing the important parts of the control section for the copying machine.

Switch SW1 "on" data is input to a CPU 131 via an I/O interface 134. A ROM 132 which is coupled to the CPU 131 contains a program to control the functions of the CPU 131. The CPU 131 feeds control data to a motor driver 135, a solenoid driver 136, a copy lamp regulator (CLR) 137, a relay switch (switching means) 138, etc. under the control of that program. At this time, part of the memory area of a RAM 133 is assigned as a working area.

The CLR 137 is provided to regulate the power supplied to the light sources 102a and 102b, or the light source 103a, the power being regulated according to the desired copy density, external voltage variations, etc. The light sources 102a and 102b and the light source 103a are connected in parallel with each other, and the power from the CLR 137 is supplied to the light sources 102a and 102b or the light source 103a whichever selected by the operation of the relay switch 138. The motor driver 135 controls the rotating speed of the main motor M1. The solenoid driver 136 drives the solenoid SOL1 in a selected manner to rotate the mirror 15. The main motor M1 supplies rotating force to a pressure developing roller, a paper supply roller, a glossing unit roller, etc. which are described later, via a transmission mechanism (not shown).

A photosensitive sheet mounting section is provided in the left part of the image forming apparatus. A photosensitive sheet 104 is formed from a sheet of aluminum or other light reflecting material coated with pressure-rupturable capsules of approximately 10 to 20 $\mu$m in diameter containing photohardening materials, chromogenic materials, etc. The pressure-rupturable capsules harden when exposed to light, and rupture when pressure is applied, causing the enclosed chromogenic materials to flow out. The photosensitive sheet is used in combination with a image receiving sheet hereinafter described as a pair of photosensitive and pressure-sensitive sheets. The image receiving sheet is made of paper coated with thermoplastic resin and developing materials (for giving rise to color with the chromogenic materials).

The photosensitive sheet 104 is wound on a sheet supply rod 151, and is accommodated in a compartment R of a cartridge 105, which is formed from a light shielding material, for protection from external light and pressure. The sheet supply rod 151 is capable of being locked by means of a ratchet mechanism which includes a solenoid. The cartridge 105 also includes a takeup rod 152 which takes up the photosensitive sheet as it is used. The takeup rod 152 is constantly urged in the same direction as the photosensitive sheet 104 is taken up, thus eliminating the slack in the photosensitive sheet 104. When used up, the photosensitive sheet 104 is replaced together with the cartridge 105.

The replacement of the cartridge 105 is accomplished by removal from and loading in a bucket 106. The bucket 106 is installed slidably along sliders 161 toward the front side of the image forming apparatus so that the cartridge 105 can be put into it from above. Provided at the upper right end of the bucket 106 is a tractor-roller 162 having pins 162a around each end thereof. In the fresh cartridge 105, the photosensitive sheet 104 is accommodated with only its leading edge portion drawn out through an opening 153 of the compartment R. The leading edge of the photosensitive sheet 104 is manually pulled out and applied on the tractor-roller 162. The photosensitive sheet has a leader sheet attached to the leading edge thereof. The leader sheet is provided with sufficient stiffness and has a slightly wider width than the photosensitive sheet itself. Holes formed in each side of the leader sheet are engaged with the pins 162a of the tractor-roller 162. When the bucket 106 is pushed into the image forming apparatus with the leader sheet applied on the tractor-roller 162, a bucket sensor S2 is activated, and when the front cover of the image forming apparatus is closed, a cover switch S3 is activated. With the activation of these two switches, auto loading of the photosensitive sheet (automatic setting of the photosensitive sheet) is performed.

Provided to the right of the photosensitive sheet mounting section are a exposure plate 107, a buffer roller 108, and a pressure-developing unit 109 The photosensitive sheet applied on the tractor-roller 162 at first is further delivered by the action of the auto loading to pass the exposure plate 107, the buffer roller 108, and the pressure-developing unit 109, and is taken up on the takeup roller 152. The light reflected from the original or transmitted through the slidefilm is projected onto the exposure point P on the exposure plate 107 to expose the photosensitive sheet 104. By exposure, a latent image (an image formed with selectively hardened pressure-rupturable capsules) corresponding to the image of the original or slidefilm is formed on the photosensitive sheet 104. A heater 171 is turned on during the exposure process and provided to maintain the temperature of the photosensitive sheet 104 at a constant level because the photosensitivity of the photosensitive sheet 104 varies with temperature.

The pressure-developing unit 109 comprises upper and lower pressure rollers 191 and 192 with a pressure-developing point P2 interposed therebetween. Disposed above the upper pressure roller 191 are backup rollers 191a and 191b which are used to provide the upper pressure roller 191 with downwardly urging force uniformly in its axial direction. A spring and a cam, which are not shown, are used to apply pressure to and release pressure from the upper and lower pressure roller, as well as for the adjustment of the pressure. The upper and lower pressure rollers 191 and 192 are made to apply proper pressure only in the pressure-developing process, and the pressure is released in other processing steps.

The buffer roller 108 is movable in directions shown by arrows M and N in FIG. 8. A motor not shown is used to move the buffer roller 108. In this image forming apparatus, the pressure-developing process is performed after the completion of the exposure process. This allows the setting of the exposure speed independently of the pressure-developing speed, which contributes the improvement of copy image quality. The buffer roller 108 is used to change the speed at which the photosensitive sheet is transported. In the exposure process, exposure is performed while the buffer roller 108 is being moved in the direction shown by the arrow M. This causes the portion of the photosensitive sheet 104 on which a latent image is formed to be drawn into a buffer area provided to the upper right of the exposure plate. When the exposure is completed, the buffer roller 108 is moved in the arrow direction N to transport the portion of the photosensitive sheet 104 on which the latent image is formed toward the pressure-developing unit 109. At this time, the image receiving sheet is superposed on the latent image on the photosensitive sheet 104 and pressure is applied thereto.

A paper cassette 110 is mounted in the right side panel of the image forming apparatus. The paper cassette 110 holds image receiving sheets 111 which are fed out one by one by means of a paper supply unit 112. The image receiving sheet 111 thus fed out is temporarily stopped by the timing roller 113, and is delivered at such timing that it is superposed on the latent image on the photosensitive sheet. When the leading edge of the latent image on the photosensitive sheet 104 and the leading edge of the image receiving sheet 111 reach the pressure-developing point P2, the sheets 104 and 111 are temporarily stopped and pressed together by the upper and lower pressure rollers 191 and 192. With sufficient pressure applied, the upper and lower pressure rollers 191 and 192 are made to rotate for pressure transfer. At this time, the buffer roller 108 is moved in the direction shown by the arrow N by means of a motor, as previously described. When the photosensitive sheet 104 and the image receiving sheet 111 are superposed and pressed together, unhardened pressure-rupturable capsules are ruptured, causing the enclosed chromogenic materials to flow out. The chromogenic materials give colors by reaction with the developing materials to produce an image on the image receiving sheet. Thereafter, the two sheets are separated from each other, the photosensitive sheet 104 being taken up on the takeup rod 152 while the image receiving sheet 111 is being fed to a glossing unit 114.

The glossing unit 114 applies heat and pressure to the image receiving sheet 111 to cause the resin coated thereon to soften and cover the surface of the image, and to smoothen the surface covered with the resin, thus giving glossiness to the produced image. The heating also helps to accelerate the coloring reaction of the chromogenic materials. The image receiving sheet 111 having the image thus produced is discharged to a paper ejection tray 115 provided on the left side of the image forming apparatus.

Figure 10:
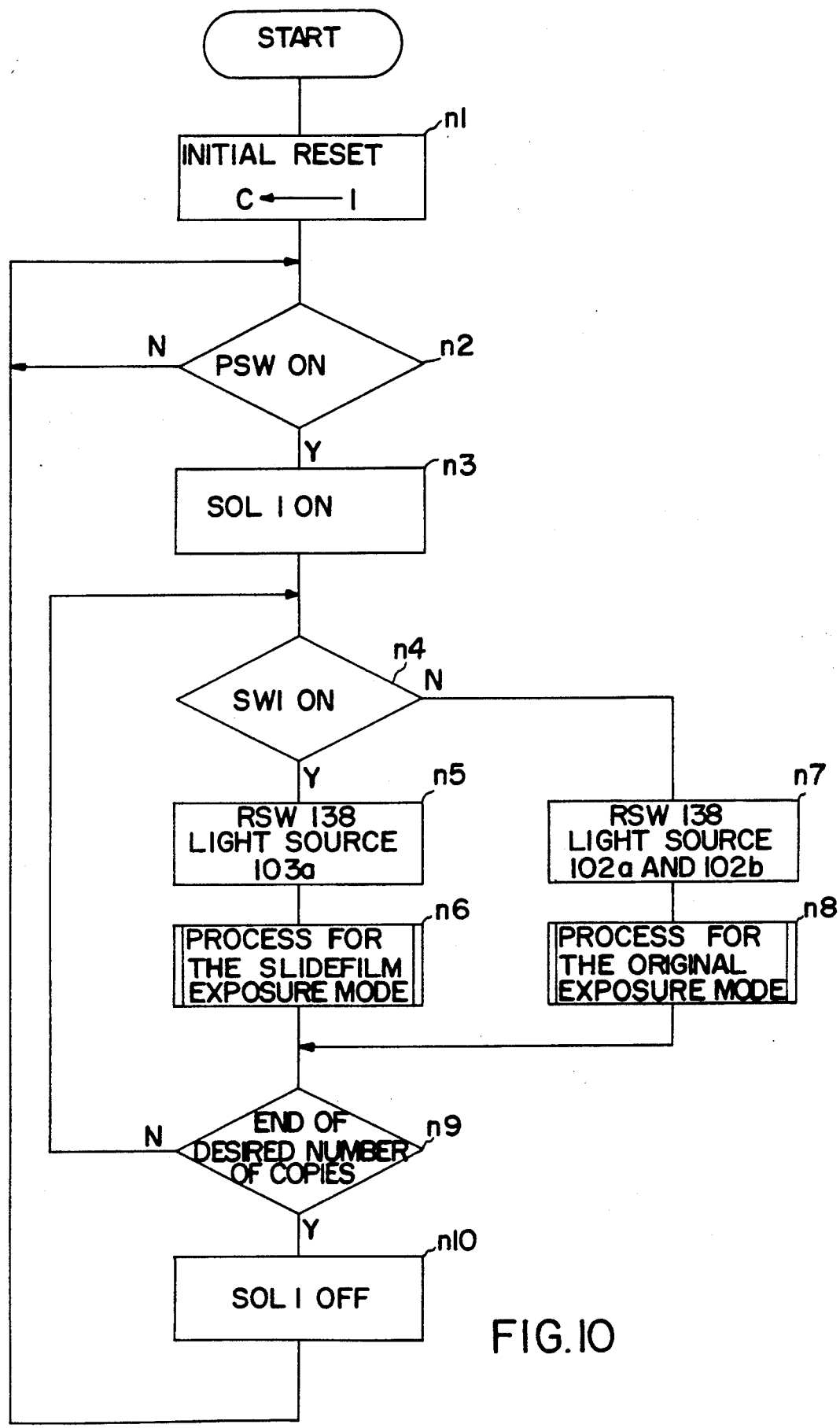
FIG. 10 is a flow chart illustrating part of the processing procedure of a control section of the copying machine of FIG. 8.
Figure 11:
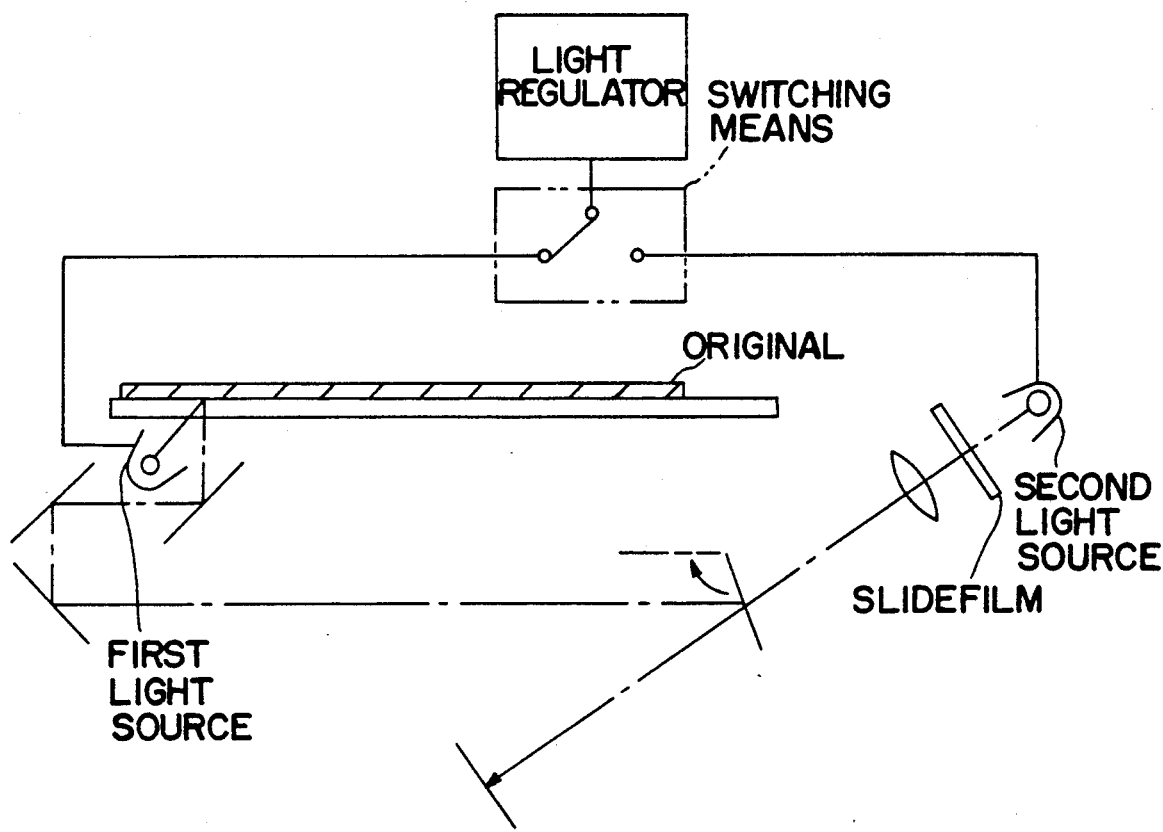
FIG. 11 is a conceptual diagram illustrating an important part of the copying machine of FIG. 8.

FIG. 10 is a flowchart showing the processing procedure for the important parts of the control section for the copying machine. The operation is described below with reference to FIG. 11 showing a conceptual diagram of this embodiment.

After the initial processing is completed, a CPU 31 is put in a standby state for the operation of the print switch (n1, n2). In the meantime, if a slidefilm is to be copied, the slide projector 103 is set, and the mirror 15 is rotated by rotating the knob 41. When the print switch is operated, the solenoid SOL1 is energized (n3). When the solenoid SOL1 is energized, the knob 41 becomes locked to hold the mirror 15 in position. Next, the CPU 31 checks the on/off state of the switch SW1

(n4). When the switch SW1 is on, the relay switch 138 is turned over to the second light source 103a for exposure of the slidefilm (n5→n6), and when the switch is off, the relay switch 138 is turned over to the first light sources 102a and 102b for exposure of the original Z on the original table 101 (n7→n8). For exposure of the slidefilm, the slidefilm supporting member 103b is moved in the direction shown by an arrow in the light path of the light source 103a so that the slidefilm is scanned. On the other hand, for exposure of the original Z, the light source unit (light sources 102a and 102b, and mirror 102c) and the mirror unit (mirrors 102d and 102e) are moved at their prescribed speeds for scanning the original. The light thus reflected is projected onto the exposure point P.

After a specified number of copies are made, the slenoid SOL1 is de-energized, allowing the mirror 15 to be returned to the reflecting position.

According to this embodiment, either one of a first or a second light source is selected for exposure when an image is formed. That is, the two light sources are not used at the same time. Therefore, one light regulator can serve the purpose satisfactorily by supplying its output to the light source selected for use.

In this embodiment, the relay switch 138 activated according to the on/off state of the SW1 is used as a switching means, but alternatively, it may be so constructed that the switch can be activated directly by the swinging action of the mirror 15 or that the relay switch 138 can be activated by inputting selection from the operation panel.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A copying machine in which light reflected from an original on an original table is directed through a prescribed light path, the light being then reflected by a prescribed mirror disposed in said light path toward a moving photosensitive member, by operating an operating unit including a first light source, said copying machine including:
    a slide projector having a slidefilm supporting means which movably supports a slidefilm and a second light source which illuminates the slidefilm, said slide projector being provided in such a way that said mirror and said photosensitive member are positioned in the light path of said second light source,
    said mirror being movable to a reflecting position for reflecting the reflected light from the original onto the photosensitive member as well as to a retracted position for allowing the light from the slide projector to be directly projected onto the photosensitive member;
    said copying machine further including a detecting means for detecting whether said mirror is in said reflecting position or in said retracted position, the speed of said moving photosensitive member being changed on the basis of the detected result of said detecting means.

2. A copying machine according to claim 1, wherein said mirror is adapted to be moved manually.

3. A copying machine according to claim 2, wherein said detecting means is for directly detecting the position of said mirror.

4. A copying machine according to claim 1, further including a driving means, controllable by an operating switch located on an operation panel, for moving said mirror.

5. A copying machine according to claim 4, wherein said detecting means is for detecting the state of said switch so as to determine the position of said mirror.

6. A copying machine in which light reflected from an original on an original table is directed through a prescribed light path, the light being then reflected by a prescribed mirror disposed in said light path toward a moving photosensitive member, by operating an operating unit including a first light source, said copying machine including:
    a slide projector having a slidefilm supporting means which supports a slidefilm movably and a second light source which illuminates the slidefilm, said slide projector being provided in such a way that said mirror and said photosensitive member are positioned in the light path of said second light source, and
    a light regulator connected to said first light source for regulating power supply to said first light source,
    said mirror being movable to a reflecting position for reflecting the reflected light from the original onto the photosensitive member as well as to a retracted position for allowing the light from the slide projector to be directly projected onto the photosensitive member;
    said copying machine further including a detecting means for detecting whether said mirror is in said reflecting position or in said retracted position, either one of said first light source or said second light source being selectively put into operation on the basis of the detected result of said detecting means, said light regulator being connected to said second light source on the basis of the detected result of said detecting means.

7. A copying machine according to claim 6, wherein said mirror is adapted to be moved manually.

8. A copying machine according to claim 7, wherein said detecting means is for directly detecting the position of said mirror.

9. A copying machine according to claim 6, further including a driving means, controllable by an operating switch located on an operation panel, for moving said mirror.

10. A copying machine according to claim 9, wherein said detecting means if for detecting the state of said switch so as to determine the position of said mirror.

* * * * *